United States Patent [19]

Smith

[11] Patent Number: 4,769,741

[45] Date of Patent: Sep. 6, 1988

[54] ELECTRICAL MODULE AND METHOD FOR THE MANUFACTURE THEREOF

[75] Inventor: Paul R. Smith, Chester, N.J.

[73] Assignee: General Electric Company, Schenectady, N.Y.

[21] Appl. No.: 811,274

[22] Filed: Dec. 20, 1985

[51] Int. Cl.$^4$ .............................................. H05K 1/02
[52] U.S. Cl. ..................................... 361/395; 361/398
[58] Field of Search ................. 29/412, 413, 830, 837, 29/839; 361/392, 393, 394, 395, 398, 399, 412, 413; 174/138 D

[56] References Cited

U.S. PATENT DOCUMENTS

| | | | |
|---|---|---|---|
| 2,647,224 | 7/1953 | Bruck | 361/398 |
| 3,113,248 | 12/1963 | Friedman | 361/398 |
| 3,427,715 | 2/1969 | Mika | 361/398 |
| 3,467,892 | 9/1969 | Sprude et al. | 361/392 |
| 3,780,431 | 12/1973 | Feeney | 29/830 |
| 4,143,577 | 3/1979 | Eberhardt | 174/138 D |
| 4,216,523 | 8/1980 | Harford | 29/413 |
| 4,227,238 | 10/1980 | Saito | 361/398 |
| 4,343,084 | 8/1982 | Wilmarth | 29/413 |
| 4,635,326 | 1/1987 | Yagi | 361/412 |

FOREIGN PATENT DOCUMENTS

| | | | |
|---|---|---|---|
| 0033677 | 8/1981 | European Pat. Off. | 29/830 |
| 0938327 | 10/1963 | United Kingdom | 361/412 |
| 2160366 | 6/1985 | United Kingdom | . |

*Primary Examiner*—A. D. Pellinen
*Assistant Examiner*—Gregory D. Thompson
*Attorney, Agent, or Firm*—William Squire; James C. Davis, Jr.; Paul R. Webb II

[57] ABSTRACT

An electrical module is provided which is made of a number different types of mechanically and electrically interconnected printed circuit board assemblies. The different types of printed circuit board assemblies required for the electrical module are manufactured simultaneously on a single printed circuit board panel. After the printed circuit board assemblies are completed and preferably tested, the printed circuit board panel is divided into individual printed circuit board assemblies. The printed circuit board assemblies are then mechanically folded together to form an electrical module which preferably has substantially all of the electrical connections within the interior of the electrical module.

4 Claims, 5 Drawing Sheets

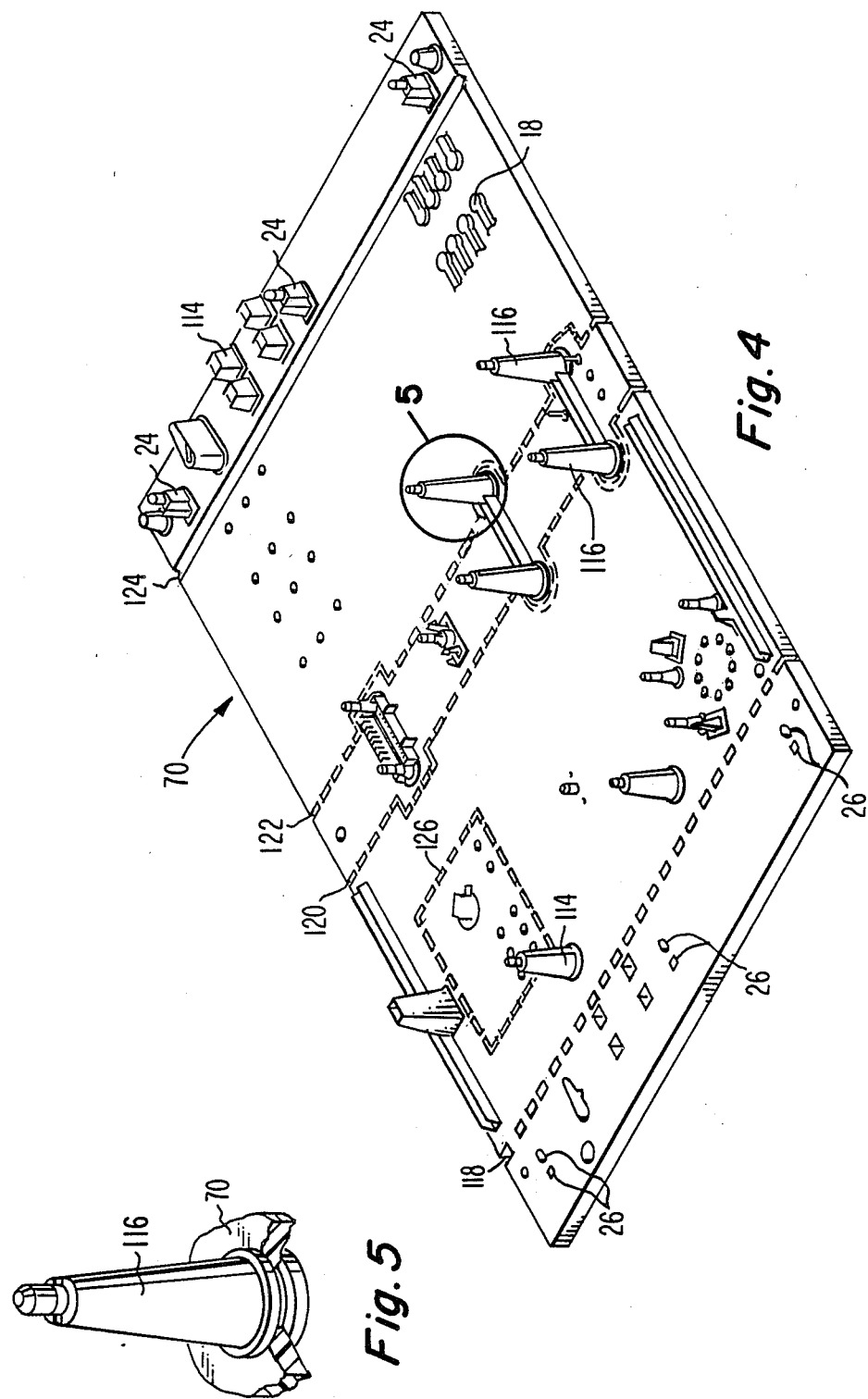

ELECTRICAL MODULE AND METHOD FOR THE MANUFACTURE THEREOF

This invention relates to an electrical module comprised of a plurality of mechanically and electrically interconnected printed circuit board assemblies and to a novel method for the manufacture of the module.

BACKGROUND OF THE INVENTION

Of interest is copending application Ser. No. 811,824, filed concurrently herewith, entitled "Printed Circuit Board Assembly and Method for the Manufacture Thereof" by Robert Warren Jebens and Gerard Samuels, and assigned to the assignee of the present invention.

Printed circuit board assemblies (hereinafter referred to as PCB assemblies) are used in the manufacture of electrical apparatus, such as television receivers, video cassette recorders, computers and the like. The PCB assemblies which are most commonly employed in electrical apparatus are comprised of an insulative substrate having printed circuitry formed on one surface of the substrate and leaded electrical components mounted on the opposite surface of the substrate, with the leads of the electrical components extending through apertures in the substrate and being electrically connected to the printed circuitry. More recently, PCB assemblies have come into commercial use which have printed circuitry on both surfaces and also include surface mounted components wherein the components are soldered directly to the printed circuitry.

All but the most simple types of electrical apparatus generally require a number of different types of PCB assemblies. Certain of the PCB assemblies are preferably positioned at certain locations in the electrical apparatus. For example, in consumer products such as televisions, video cassette recorders, home computers and the like, the operating controls are typically located at the face surface of the electrical apparatus and, accordingly, the PCB assemblies, which include the operating control components, are likewise located adjacent the face surface of the electrical apparatus. On the other hand, the gross adjustments, electrical power connectors, cable connectors and the like, are typically located at the rear of the electrical apparatus and, accordingly, the PCB assemblies, including the rear mounted components, are located adjacent the back surface of the electrical apparatus. Other types of PCB assemblies, such as the kinescope circuit board of a television set receiver, are required to be mounted at a specific funtionally defined location within the electrical apparatus, as, for example, on the end of the television picture tube. There are also often space limitations within the electrical apparatus which prevent mounting all the required electrical components on a single PCB assembly. In latter situations, it is common practice to use a number of separate smaller PCB assemblies which are mounted at various locations within the electrical apparatus.

It is conventional practice when the electrical apparatus contains a number of different types of PCB assemblies to manufacture all of the required number of a particular type of PCB assembly in a batchwise fashion. The different types of PCB assemblies required for the electrical apparatus may be manufactured at different locations, at different times and under substantially different production conditions.

When the required number of each type of PCB assemblies has been manufactured, the PCB assemblies are sent to an assembly area. In the typical assembly process, each of the various types of PCB assemblies is initially physically secured with brackets, screws or the like, in prescribed locations relative to the chassis of the electrical apparatus being assembled. Thereafter, the individual PCB assemblies are electrically connected to each other using connector cable, jumper wires or the like. The electrical connection of the individual PCB assemblies is typically performed in a soldering operation on the final assembly line.

The conventional method of manufacturing electrical apparatus which include a plurality of PCB assemblies, such as that generally described above, has many inherent problems. The batchwise manufacture of each of the individual types of printed circuit boards required for a particular electrical apparatus inherently increases the overall manufacturing cost and can result in a substantial increase in the rejection rate for the final assembled electrical apparatus. Since all of the different types of PCB assemblies must be prepared prior to the final assembly of the electrical apparatus, a substantial number of each type of PCB assembly must be inventoried which adds to the overall production cost. Furthermore, a shortage of one of the required types of PCB assemblies can cause an expensive shutdown of an entire final assembly line.

A still further and even more serious problem is that even if an adequate supply of PCB assemblies is maintained, if all PCB assemblies made in a particular batch are found defective, as, for example, because of poor wave soldering, the entire final product made with the defective PCB assemblies will also be defective. A still further problem with the batch method of making each type of PCB assemblies is that the individual PCB assemblies, when separately inspected prior to final assembly, may appear to be satisfactory, but when electrically connected with other types of PCB assemblies manufactured under slightly different conditions, may prove to be electrically incompatable due to differences in the printed circuit boards, metal composition of the solders, the soldering condition employed in the manufacture of the PCB assemblies and other similar problems.

Another serious problem is that the mechanical attachment and the electrical connection of the individual PCB assemblies during final assembly of the electrical apparatus is expensive and time-consuming. Furthermore, the electrical leads connecting the individual PCB assemblies must be precisely positioned and correctly soldered in order for the assembled electrical apparatus to operate properly. However, under the conditions generally encountered during final assembly, considerable errors are often made which require expensive troubleshooting and rework to correct the errors. Even if the electrical leads are properly connected, the large number of exposed wires and connections are a constant source of problem in that during assembly, and during maintainence, the connections easily can be broken inadvertently.

It would be highly desirable if a method could be provided for producing more reliable PCB assemblies which more simply and with less defects could be mechanically secured and electrically connected to other components of an electrical apparatus during final assembly of the electrical apparatus.

SUMMARY OF THE INVENTION

An electrical module is provided which is made of a number of different types of mechanically and electrically interconnected PCB assemblies. The different types of PCB assemblies required for the electrical module are manufactured simultaneously on a single printed circuit board panel. After the PCB assemblies are completed and preferably tested, the printed circuit board panel is broken into individual PCB assemblies. The PCB assemblies are then folded together to form an electrical module which preferably has substantially all of the electrical connections between the printed circuit board assemblies within the interior of the electrical module.

BRIEF DESCRIPTION OF THE DRAWING

FIG. 4 is an isometric illustration of the panel of FIG. 3 with mechanical members positioned in certain of the apertures.

FIG. 5 is an enlargement taken as indicated by the circle and number 5 on FIG. 4 of a mechanical member molded in situ in an aperture.

DETAILED DESCRIPTION OF THE PREFERRED INVENTION

Figure 1:
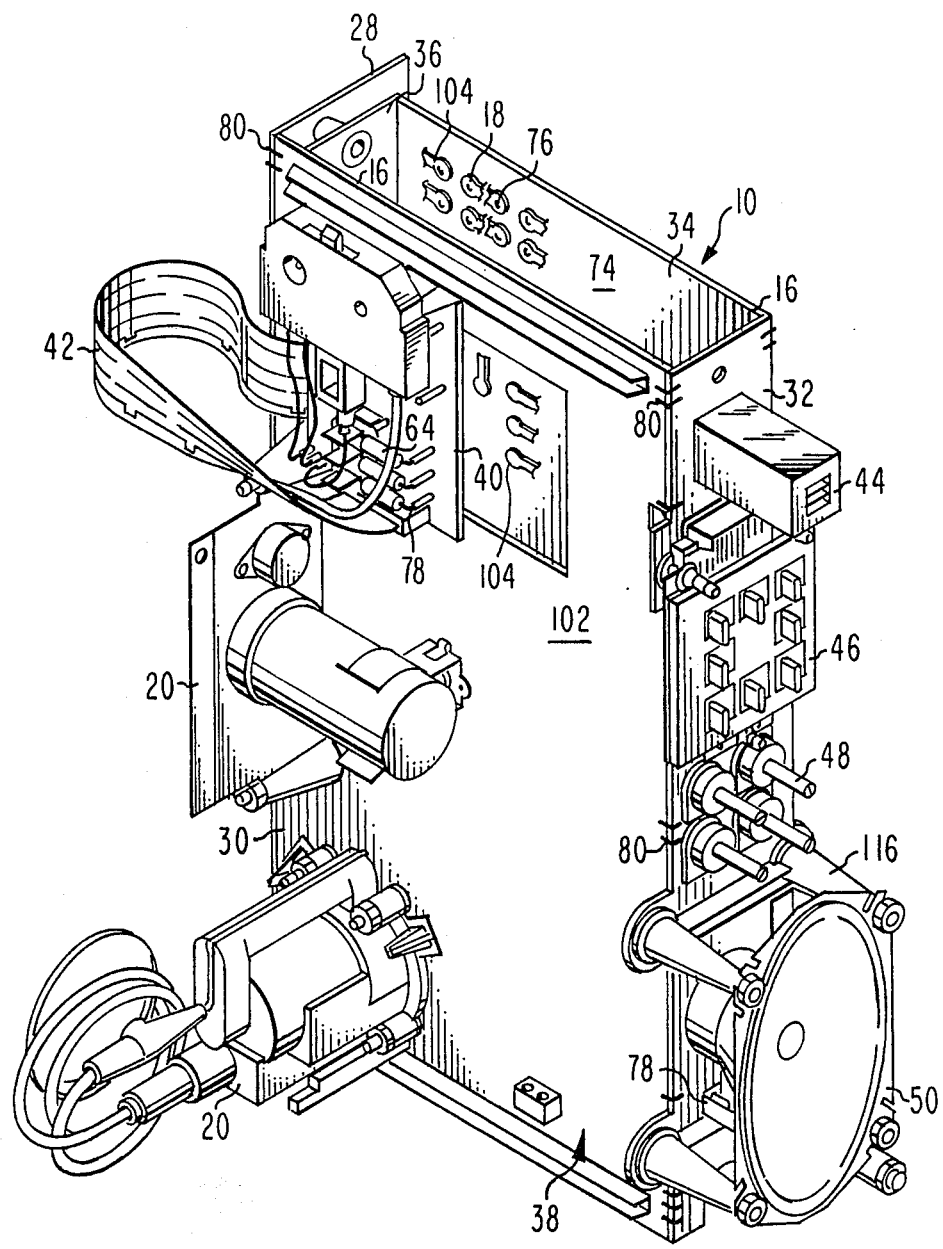
FIG. 1 is an isometric illustration of a typical electrical module of the present invention.

In FIG. 1 there is illustrated a typical electrical module 10 of the present invention. For purposes of facilitating the explanation of the present invention, an electrical module 10 which is specifically designed for use with a television receiver is shown in FIG. 1. It should be appreciated, however, that the present invention is not limited to electrical modules 10 for television receivers but can be used to form electrical modules 10 for a variety of different types of electrical apparatus by varying the electrical circuitry, electrical components and size and shape of the electrical module 10 as required for a particular application.

Figure 6:
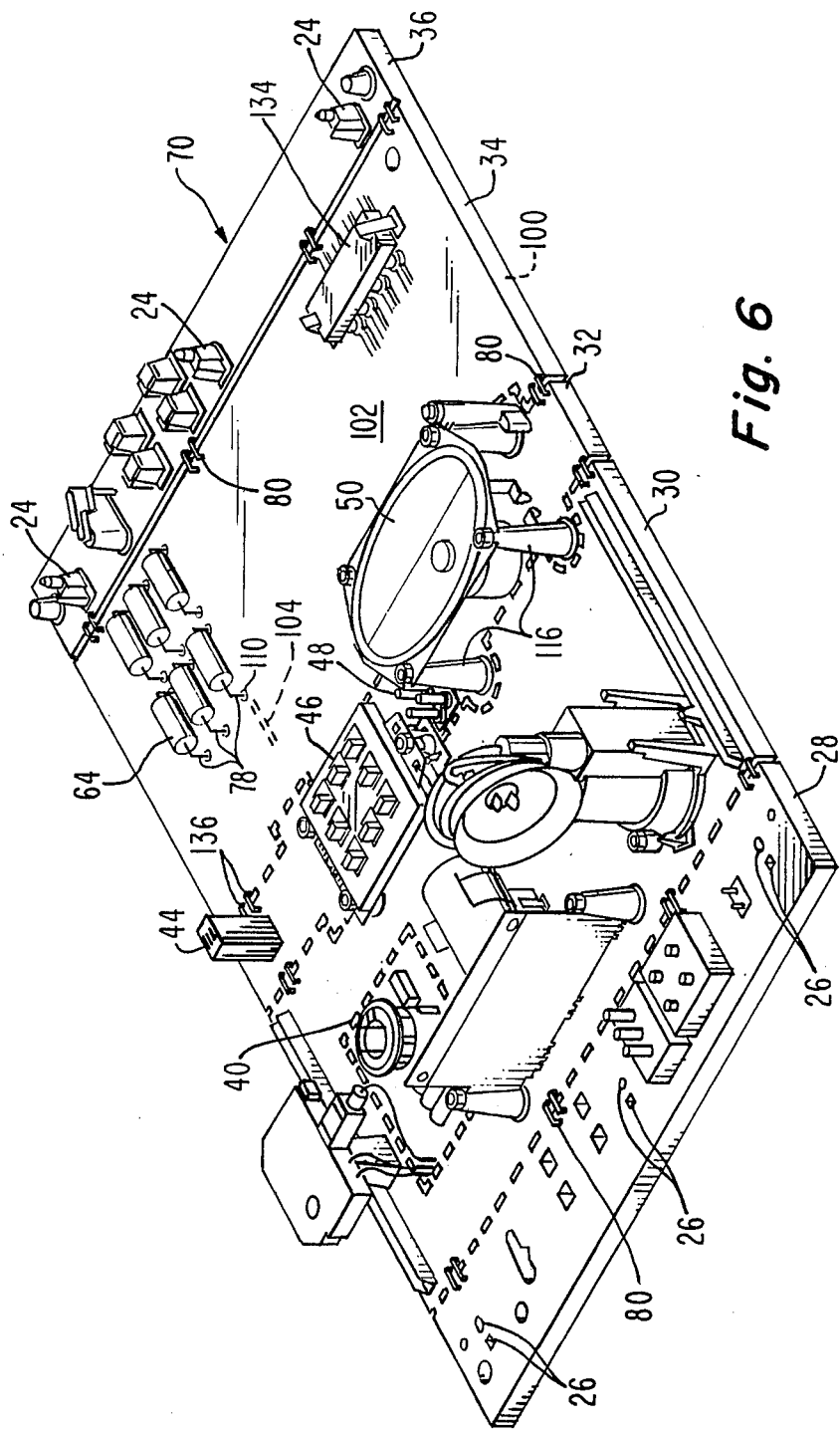
FIG. 6 is an isometric illustration of the panel of FIG. 4 shown populated with electrical components.

The term printed circuit board assembly (or PCB assembly) as used hereinafter refers to a board structure used in forming an electrical module 10 according to this invention. The PCB assemblies, e.g. assembly 34 typically include an insulative substrate, e.g., substrate 16, printed circuitry, e.g., circuitry 18 formed on at least one of the surfaces of the substrate 16, and electrical components positioned on the substrate 16 and electrically connected to the printed circuitry 18. It should be noted, however, that the term printed circuit board assembly (or PCB assembly) as used hereinafter can also refer to a board structure required to form the electrical module 10, which does not include electrical components such as components 20 or the like and may include mechanical members, such as clips 24 and mating apertures 26 (FIG. 6), defined in the board so that the electrical module 10 can be assembled.

The specific electrical module 10 shown in FIG. 1 is comprised of five PCB assemblies 28, 30, 32, 34 and 36 which are mechanically and electrically connected together to form a generally rectangular-shaped body 38 and a sixth PCB assembly 40 which, as shown, is physically separated from the rectangular body 38 but electrically connected to the rectangular body 38 with an electrical connector strap 42. The reason for the sixth PCB assembly 40 being physically separated from the rectangular body 38 is that when the electrical module 10 is used in an electrical apparatus, the separated PCB assembly 40 will be physically located at a distance from the remainder of the PCB assemblies 28, 30, 32, 34 and 36 comprising the rectangular body 38 but will electrically cooperate with the other PCB assemblies, as will be explained below in greater detail.

Figure 2:
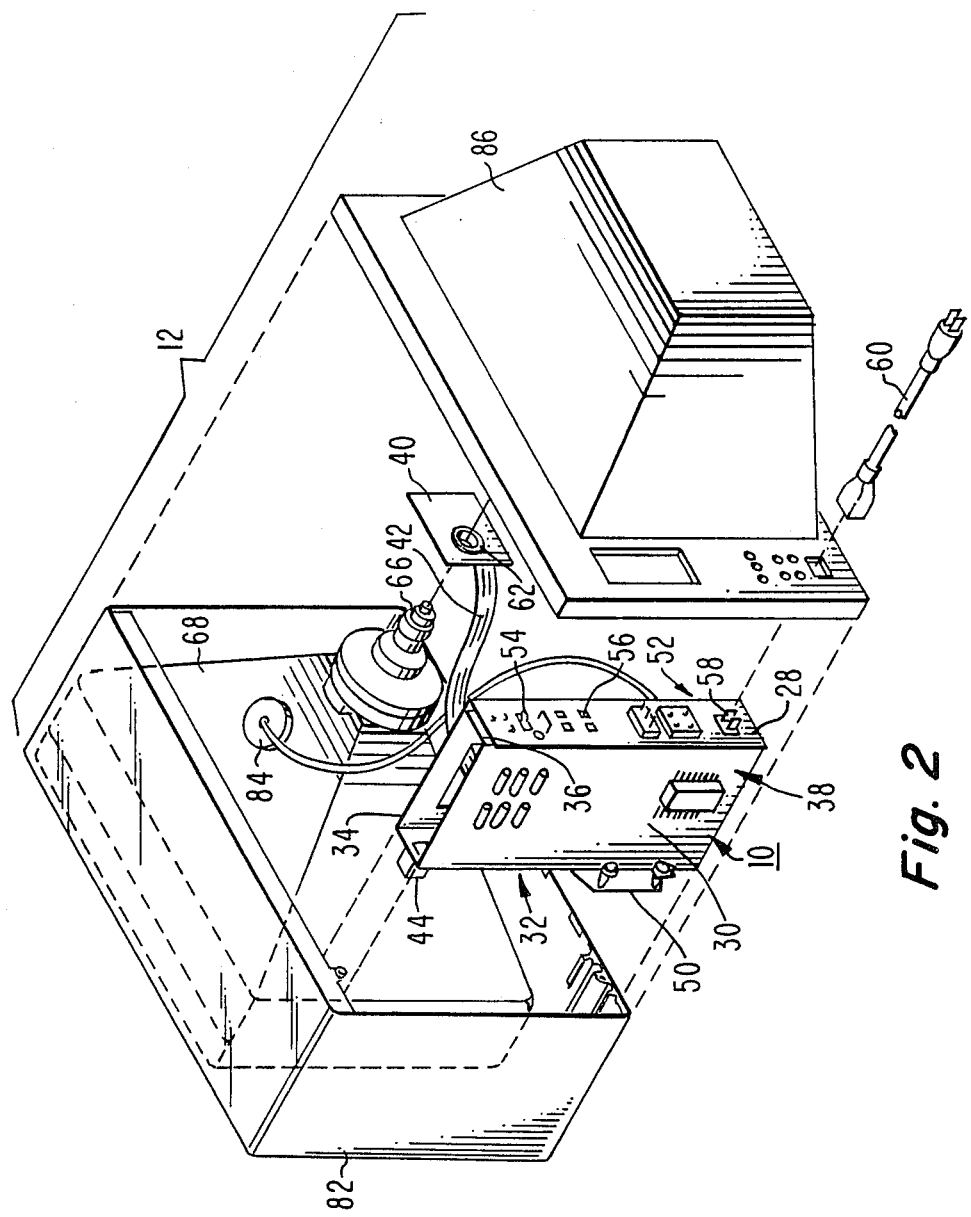
FIG. 2 is a blown-up view showing a typical final assembly procedure using the electrical module of this invention.

As indicated above, the electrical module 10 shown in FIG. 1 is specifically designed for use in a television receiver 12, such as is shown in a blown-apart configuration in FIG. 2. Accordingly, the front PCB assembly 32, which will be positioned adjacent the front side of the assembled television receiver 12, has mounted on it the operational control electrical components which are required to be or desirably should be located at the front of a television receiver. These electrical components include a remote control pickup 44, a push button channel selector 46, video color controls 48 and a speaker 50. As can best be seen in FIG. 2, the PCB assemblies 28 and 36, which, in combination form the rear board assembly 52 of the rectangular body 38 and which will be adjacent the rear side of the assembled television receiver 12, include an antenna switch 54, connectors 56 for the antenna and a connector 58 for a power cable 60. The PCB assemblies 30 and 34, which form the broad sides of the rectangular body 38, include the additional electrical components such as the video and audio circuitry and electrical components required for operation of the television receiver 12 which do not have to be positioned at a specific location within the television receiver 12. The separated PCB assembly 40 includes a kinescope socket 62, resistors 64 (FIG. 1) and the like and as shown in FIG. 2, which will be mechanically secured and electrically connected to the end 66 of the picture tube 68 during final assembly of the telvision receiver 12.

Figure 3:
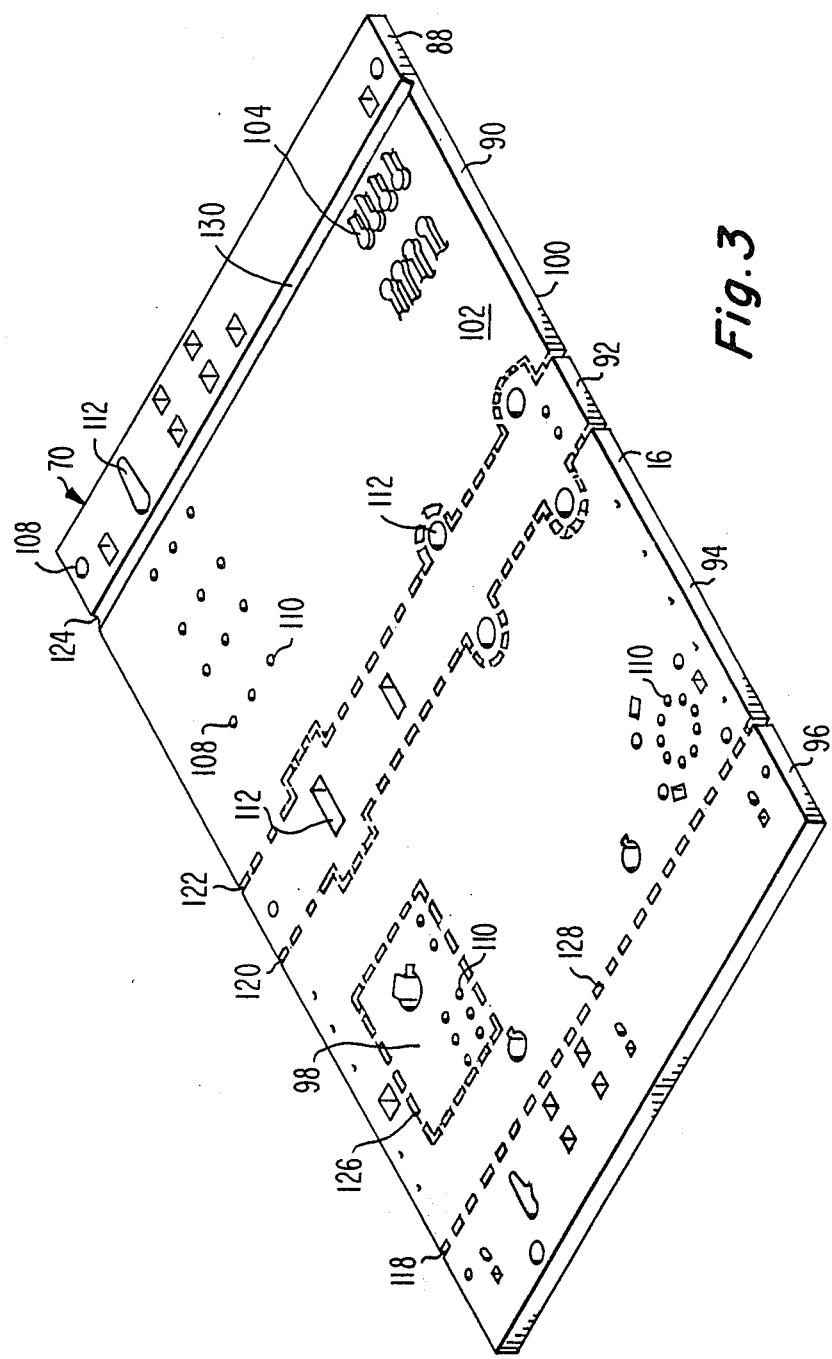
FIG. 3 is an isometric illustration of a printed circuit board panel having apertures and break lines formed therein.

In the preferred embodiment of the electrical module 10 of this invention, all of the PCB assemblies 28, 30, 32, 34, 36 and 40 which comprise the electrical module 10 are manufactured simultaneously using the same printed circuit board panel 70 (FIG. 3). As a result, all the PCB assemblies are inherently made under identical process conditions so that all the PCB assemblies are compatible with each other with respect to their electrical properties. Furthermore, since all the PCB assemblies are formed at the same time and under the same conditions, there is substantially less chance that a single PCB assembly will be defective. Furthermore, since all of the PCB assemblies used in the electrical module 10 of this invention are made at the same time and assembled as an electrical module 10 prior to installation in an electrical apparatus, the module 10 can be tested prior to final assembly which substantially reduces production cost due to mismatched or defective PCB assemblies found during final assembly.

In order to insure that the proper number of satisfactory electrical modules 10 are prepared for the required number of electrical apparatus to be produced, it is good practice to make at the same time a number of extra PCB panels 70 under the same production conditions using printed circuit boards from the same lot. The additional PCB assembly panels 70 can then be divided into spare individual PCB assemblies 28, 30, 32, 34, and 36. Thereafter, if a particular electrical module 10 is found to have a defective PCB assembly, one of the spare PCB assemblies can be used in place of the defective PCB assembly. Since the spare PCB assembly was manufactured at the same time and under the same conditions and from the same lot of printed circuit boards, it will be equivalent to the other satisfactory PCB assemblies of the salvaged electrical module. For purposes of this invention, therefore, replacement PCB assemblies manufactured as noted above are considered to be equivalent to the remainder of the PCB assemblies of the salvaged electrical module.

In the preferred embodiment of this invention, as shown in FIG. 1, the electrical module 10 is formed in a folded, rectangular configuration having an open interior space 74. It should be appreciated, however, that different numbers of PCB assemblies can be used to make modules; two PCB assemblies can be used to make an L-shaped module; three PCB assemblies for a triangular shaped module; and so forth. The printed circuitry 18 and the connection 76 of the leads 78 of electrical components to the printed circuitry 18 are preferably positioned within the interior space 74 of the electrical module 10. This is a substantial advantage in that electrical connections and the like are protected from physical damage. Furthermore, the number of electrical connections 76 which must be made during final assembly is substantially reduced as compared to a method wherein the individual PCB assemblies are positioned at spaced apart locations in the electrical apparatus and connected to each other during final assembly.

In order to facilitate both the initial assembly of the electrical module 10 and any service thereafter required involving the electrical module 10, the PCB assemblies are preferably mechanically hinged to adjacent PCB assemblies so the electrical module 10 can initially be folded together and thereafter unfolded for service. This is preferably achieved by using relatively ductile but strong jumper wires 80 to both electrically and mechanically connect the adjacent edges of the PCB assemblies 14 together.

To provide additional rigidity to the electrical module 10 illustrated in FIG. 1, five PCB assemblies are preferably used to make a rectangle with the rear wall being formed with two PCB assemblies 28 and 36 which are parallel and mechanically attached to each other. The above arrangement prevents relative movement of all of the individual PCB assemblies of the electrical module 10.

The method of assembling an electrical apparatus using the electrical module 10 of this invention is illustrated in FIG. 2 which shows a blow up of the assembly of a television receiver 12. A television picture tube 68 is mounted in a television cabinet 82. The electrical module 10 is mechanically secured in position within the television cabinet 82 with the front PCB assembly 32 which includes the operating controls being at the front of the television cabinet 82. The rear PCB assemblies 28 and 36 of the electrical module 10 which includes the rear connectors are located at the back of the television cabinet 82. The separate PCB assembly 40 is secured to the end 66 of the television picture tube 68 while remaining electrically connected to the electrical module 10 with the connector strap 42. The anode connection 84 extends from the electrical module 10 and is connected to the television picture tube 68. The back cover 86 is attached to the television cabinet 82 and the power cable 60 is secured to the connector 58 at the back of the television receiver 12.

The assembly of television receiver 12 as well as other types of electrical apparatus is considered simplified using the module 10 of this invention as compared to the previous methods which employed a plurality of separate PCB assemblies located at separate locations within the electrical apparatus which had to be connected together. A substantially lower defect rate is realized.

The electrical module 10 of this invention is manufactured by initially forming a printed circuit board panel 70 (FIG. 3) which includes all of the printed circuit boards 88, 90, 92, 94, 96 and 98, required to form the PCB assembly 28, 30, 32, 34, 36 and 40 to be used in the assembly of electrical module 10.

A panel of material of the type which is conventionally used for printed circuit boards is either manufactured using well-known methods or can readily be obtained from various commercial sources. The panel 70 of material which is used should have an insulative substrate with first and second opposing surfaces 100 and 102, respectively. The insulative material used to form the substrate can be, for example, a phenolic paper laminate, an epoxy glass laminate or the like. The panel should have laminated to at least the first surface 100 thereof a layer of a conductive material (not shown) such as copper if a subtractive method is to be used to form one or more printed circuit patterns 104. The panel should likewise be of sufficient size that all the PCB assemblies can be formed from the same panel 70.

The required printed circuit patterns 104 are formed on at least the first surface 100 of the substrate and can also be formed on the second surface 102 using conventional, well-known subtractive or additive processes for forming printed circuit patterns.

The next step in the manufacture process is to form aperture 108 through the panel 70 extending from the first surface 100 to the second surface 102 of the panel 70. The aperture 108 can be drilled or punched through the panel 70, with punching generally being more economical. Several functional types of aperture 108 are formed in the panel 70. The first type of apertures 110 are for the electrical leads 78 of the electrical components 20 e.g., resistors 64, FIG. 6. which will be mounted on the second surface 102 of the panel 70. The apertures 110 for the electrical leads 78 are formed in the panel 70 in registration with preselected contact points of the printed circuit patterns 104 on the first surface 100 of the panel 70. This allows the electrical component leads 78 to be electrically connected as, for example, by soldering to the printed patterns 104 on the first surface 100 of the panel 70.

A second type of apertures 112 are formed through the panel 70 which are of various sizes and shapes. The second type of apertures 112 are used to secure various types of mechanical members, such as stand-offs 116 for the speaker 50 (FIG. 6), clips 24, and mating apertures 26 for the clips 24 and the like, as will be explained below.

The next step is to form break lines 118, 120, 122, 124 and 126, in the panel for allowing the individual PCB assemblies to be eventually physically separated from each other. As shown in FIG. 3 the break lines 118, 120, 122, 124 and 126 can be formed by punching a line of perforations through the panel 70. The use of a line of perforations 128 as the break line has the advantage that the perforations 128 can easily be formed in the same or a separate punching operation as the apertures 108. However, after separation, the edges of the separated PCB assembly are somewhat rough due to the broken perforation. Alternatively, the break lines, such as the break line 124 may be a V-groove which can be machined partially through the panel 70. The V-groove provides a much smoother break but is somewhat more expensive to machine into the panel 70.

As can be seen in FIG. 3, the printed circuit board 98 of the panel 70 which will eventually become part of the separated PCB assembly 40 described above is perforated around its entire outer edge so it can readily be completely removed from the remainder of the panel 70.

In FIG. 4, after the break lines 118, 120, 122, 124 and 126 have been formed in the panel 70, the mechanical members are positioned on the panel 70. The mechanical members are used for various purposes such as holding in position electrical components and mechanically securing the electrical modules together. The mechanical members can be snapped into the appropriate apertures 112 or fastened in place with, for example, screws. However, as can be seen in FIG. 5, the mechanical members are preferably in situ molded in the apertures 112 using techniques that are disclosed in the aforementioned copending application. The mechanical members are thus firmly locked in position in the panel 70.

After the mechanical members are in position, the panel 70 is populated with the electronic components, such as resistors 64, surface mounted components 134, the channel selector 46, speaker 50 and so forth. In particular, it should be noted that jumper wires 80 made of a strong but ductile metal extend over the break lines at adjacent sections of the panel 70. The leads of the electrical components, e.g., resistors 14, FIG. 6, extend into and through the first type of apertures 110 in the panel 70 and extend to the printed circuit patterns 104 on the first surface 100 of the panel 70. A portion of the mechanical members, as seen in FIGS. 1 to 6, are used to secure several of the electrical components in position, e.g., components 20, speaker 50 and others.

After the panel 70 is populated with the electrical components, their electrical leads are connected to the printed circuit patterns. This is best done by a mass soldering and preferably by means of soldering the first surface 100 of the panel 70.

At this point in the manufacturing process it is highly desirable to conduct electrical tests of the assembled printed circuit board panel. Appropriate contacts and test areas are connected to the assembly and the assembly is tested. Any defective components or connections can readily be corrected.

The panel 70 is then separated into individual PCB assemblies 28, 30, 32, 34, 36 and 40 by breaking the panel 70 along the break lines 118, 120, 122, 124 and 126. The sixth PCB 40 is physically separated from the remainder of the panel 70.

The remaining individual PCB assemblies 28, 30, 32, 34 and 36 are now folded so as to be repositioned into a rectangular configuration as shown in FIG. 1. The jumper wires 136 act as both mechanical hinges and electrical connections between the PCB assemblies 28, 30, 32, 34 and 36. The overlapping PCB assemblies 28 and 36 are mechanically held together by means of the clips 24 which engage the mating apertures 26 which removably attach the assemblies 28 and 36 together.

The method of forming the electrical module 10 of the invention as described above can be altered by varying the order of certain steps such as forming the printed circuit patterns, apertures, break lines, and the like as is considered most appropriate for a particular application.

What is claimed is:

1. An apparatus comprising a housing and an electrical module comprised of a plurality of different types of printed circuit board assemblies simultaneously produced from the same printed circuit board panel and assembled to each other to form said module, wherein said module mates with said electrical apparatus housing having a front side and a rear side, wherein said module is formed in a rectangular configuration, one of said plurality of printed circuit board assemblies including means adapted to serve as a front printed circuit board assembly including front operational control electrical components which are aligned with openings in said electrical apparatus housing front side and another of said plurality of printed circuit board assemblies including means adapted to serve as a rear printed circuit board assembly in an opposing relationship to said first assembly, including electrical components which are aligned with openings in the rear side of said electrical apparatus housing, and wherein the electrical module is dimensioned to be positioned within said housing for said electrical apparatus with the front printed circuit board assembly adjacent to said front side and the rear printed circuit board assembly adjacent to said rear side.

2. The electrical module according to claim 1 wherein at least three of the printed circuit board assemblies are electrically and mechanically connected with jumper wire between adjacent printed circuit board assemblies and two of said three printed circuit board assemblies include means removably attaching said two assemblies together to form a rigid module.

3. The electrical module according to claim 2 wherein said means rigidly attaching comprises a clip projecting from one of said two printed circuit board assemblies and an aperture in the other printed circuit board assembly, wherein said clip engages said aperture so that said two printed circuit board assemblies are attached together.

4. The electrical module according to claim 1 which further includes a printed circuit board assembly which is physically separated but electrically connected to the electrical module.

* * * * *